United States Patent
Bruce et al.

(10) Patent No.: US 6,350,982 B1
(45) Date of Patent: Feb. 26, 2002

(54) INDUCEMENT AND DETECTION OF LATCH-UP USING A LASER SCANNING MICROSCOPE

(75) Inventors: Victoria J. Bruce; Michael R. Bruce, both of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/383,725

(22) Filed: Aug. 26, 1999

(51) Int. Cl.[7] ................................................ H01L 31/00
(52) U.S. Cl. ................................. 250/214.1; 250/214 R
(58) Field of Search ......................... 250/214.1, 214 R, 250/206; 257/431, 432; 327/514, 516; 324/500, 501

(56) References Cited

U.S. PATENT DOCUMENTS 5,621,742 A * 4/1997 Yoshino ...................... 371/28

OTHER PUBLICATIONS

Wolf, S.,*Silicon Processing for the VLSI Era*—vol. II, 1990, pp. 400–417 (Month Unknown).

* cited by examiner

*Primary Examiner*—Que T. Le

(57) ABSTRACT

According to one example embodiment, a latch-up condition in a semiconductor device is detected using a method involving use of a laser beam to scan through the backside of the semiconductor device and to ascertain an intensity threshold that is known to cause latch-up conditions. The intensity of the beam is altered and applied to designated regions within the semiconductor device to create latch-up at certain regions but not other regions. A latch-up condition present at a designated region is then detected using conventional microscopy equipment.

17 Claims, 4 Drawing Sheets

INDUCEMENT AND DETECTION OF LATCH-UP USING A LASER SCANNING MICROSCOPE

FIELD OF THE INVENTION

The present invention relates generally to semiconductor devices and, more particularly, to techniques for analyzing and debugging circuitry associated with an integrated circuit.

BACKGROUND OF THE INVENTION

In recent years, the semiconductor industry has realized tremendous advances in technology which have permitted dramatic increases in circuit density and complexity, and equally dramatic decreases in power consumption and package sizes. Present semiconductor technology now permits single-chip microprocessors with many millions of transistors, operating at speeds of hundreds of MIPS (millions of instructions per second) to be packaged in relatively small, air-cooled semiconductor device packages. A requirement of such high-density and high functionality in semiconductor devices has been the demand for increased density of individual circuitry within the chip. The increased density permits shorter electrical connections between the devices than possible in chips manufactured with circuitry in a less-dense arrangement.

A by-product of increased circuit density and decreased chip size is the occurrence of a condition known as "latch-up." Latch-up is an undesirable and sometimes self-destructive phenomenon that occurs when an inadvertent low-resistance path is created between power supply nodes (often referred to as $V_{DD}$ and $V_{SS}$) in a semiconductor device. An inadvertent low-resistance path can pass current at levels that exceed the tolerance of the circuitry carrying the path. Consequently, such large currents can generate high levels of heat, ultimately resulting in cessation of circuit functions and even permanent destruction of the circuit.

Latch-up typically occurs as a result of the proximate locations of circuits, circuit components as well as portions of circuit components, due to the high-density requirements of semiconductor devices. For example, in the design of complimentary metal-oxide semiconductor (CMOS) devices, there are complementary parasitic bipolar transistor structures that are in close proximity to one another. The close proximity allows the complimentary parasitic bipolar structures to interact electrically to form device structures that behave like pnpn diodes. Normally, such diodes are reverse-biased. However, in the presence of certain operating conditions, such as transient displacement currents, terminal over-voltage stress, ionizing radiation, or impact ionization by hot electrons, a normally reverse-biased diode becomes a forward-biased diode. Once the device becomes forward biased, current flows freely between the nodes of the device. As long as sufficient power is supplied, the device remains in the "ON" state and exhibits latch-up.

The cause of a latch-up condition in a CMOS device has been studied for some time. According one theory based on the principles of pnpn diode operation, each of four conditions exists in a CMOS circuit for latch-up to occur. These conditions are: 1) the emitter-base junctions of both parasitic bipolar transistors are forward biased; 2) the mathematical product of current gains is sufficiently large for regenerative feedback; 3) the external circuit supplies a voltage that is at least equal to the structure's holding voltage; and 4) a latch-up stimulus is present for at least a minimum latch-up trigger time. Attempts to alleviate the latch-up problem have included various ways to prevent one or more of these above conditions from occurring. For details concerning the mathematics of, and efforts to overcome, the latch-up problem, reference may be made to various references such as R. R. Troutman, *Latchup in CMOS Technology—The Problem and its Cure,* Kluwer Academic Publishers, Boston, Mass., 1986, and S. Wolf, *Silicon Processing for the VLSI Era—Volume 11,* Lattice Press, Sunset Beach, Calif. 1990, each of which is incorporated herein by reference. While the attempts to overcome and test for latch-up have been successful to various levels of degree, as addressed in the above-cited references, the latch-up problem is evolving by taking on new forms as the semiconductor industry continues to increase circuit density by shrinking device dimensions. For this reason, it is difficult to ensure that latch-up will not occur for each new design.

Newly designed high-density ICs, such as flip chips, PGAs and DIPs have circuits exposable from a substrate backside. For such circuits, testing for latch up is difficult, however, being able to effectively test the IC for circuit areas that might be more susceptible to latch-up is still an important part of the testing process. This is especially true in highly-competitive market environments where product-development costs play an important role in the success of new products. For IC circuit areas that are susceptible to latch-up, it is important that product-development efforts be able to quickly detect these circuit areas.

Heretofore, efforts to induce latch-up have been largely directed to studying how the above four conditions can be readily induced to effect a latch-up condition. Based on this information, conventional approaches to inducing latch-up are largely directed to providing stimulus at input/output ports of the IC. Effectively inducing a latch-up condition for a particular IC provides the IC designer with the knowledge that the IC design should be reevaluated. This feedback to the IC designer is lacking, however, in that the IC designer must reevaluate the IC design without necessarily knowing the specific location of the latch-up. Consequently, the IC designer is left with the burden of reevaluating many circuits that are unrelated to the cause of the detected latch-up condition.

Accordingly, semiconductor technology would benefit from an approach that effectively detects and locates that circuitry that is susceptible to latch-up conditions. The ability to detect the location of latched-up circuitry in highly-integrated circuits can be a significant step in reducing the engineering-development time, reducing or possibly eliminating the existence of such defective devices in the market and thereby reducing the overall cost of products in the marketplace.

SUMMARY OF THE INVENTION

The present invention is directed to methods and apparatuses involving the detection of a latch-up condition in a semiconductor device. In one example method embodiment, a latch-up condition is detected in a semiconductor device, via its back side, by blasting a surface of the device with electron-hole pairs sufficient to create latch-up in sensitive circuits. The device is then analyzed and, if a latch-up condition is present, it is detected as part of the analysis.

According another example embodiment, a latch-up condition in a semiconductor device is detected by using of a laser beam to scan through the backside of the semiconductor device to ascertain an intensity threshold that is known to cause latch-up conditions. The intensity of the beam is then decreased and the beam of decreased intensity is applied to a designated region within the semiconductor device. A latch-up condition present at the designated region is then detected using conventional microscopy equipment. Latched-up circuits in such designated regions are designated as being overly sensitive.

In another example embodiment, a method for detection of a latch-up condition of a semiconductor device is provided. The backside of the semiconductor device is scanned with a laser beam having an upper intensity that does not cause latch-up conditions. The intensity of the beam is then increased to another intensity to cause latch-up conditions in certain circuit areas. These circuit areas may then be used as areas for further evaluation in connection with design improvements.

In another example embodiment, a system is provided to detect a latch-up condition in a semiconductor device. The system comprises means for applying a beam, means for securing the semiconductor device so that the beam can scan through the backside of the semiconductor device at a first intensity, and means for indicating if a latch-up condition is present in response to an increased intensity of the beam over a designated region of the semiconductor device.

In yet another example embodiment, a system detects a latch-up condition in a semiconductor device using a laser device that is adapted to apply an energy field. The system includes a fixture for securing the semiconductor device so that the laser device can scan through the backside of the semiconductor device at a first intensity. A processor arrangement, including a computer, is configured and arranged to indicate automatically whether a latch-up condition is present in response to an increased intensity of the laser beam over a designated region of the semiconductor device.

The above summary is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
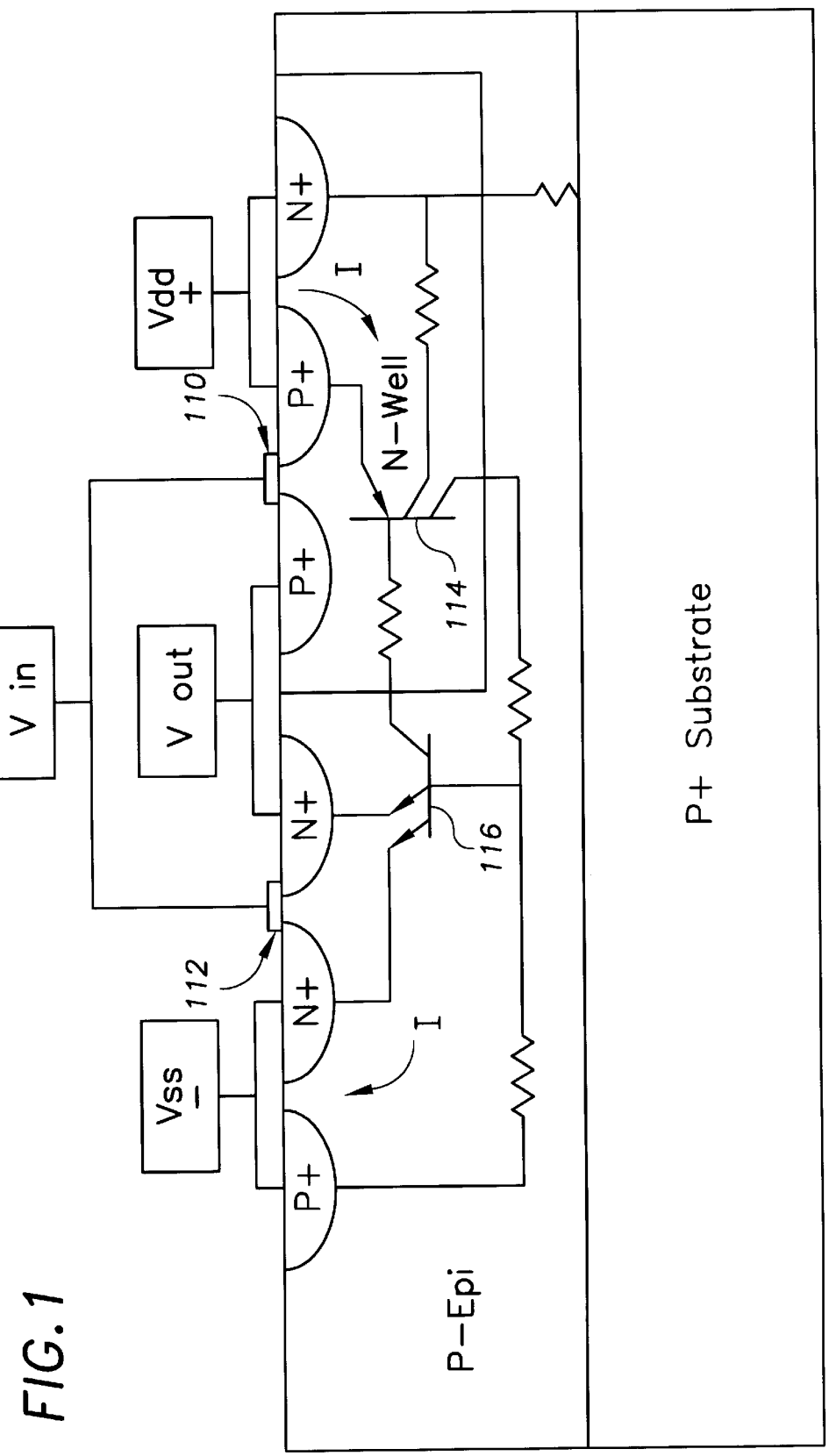
FIG. 1 is a diagram of an example circuit used to illustrate how latch-up can occur.

While the invention is amenable to various modifications and alternative forms, specifics thereof have been shown by way of example in the drawings and will be described in detail. It should be understood, however, that the intention is not to limit the invention to the particular embodiments described. On the contrary, the invention is to cover all modifications, equivalents, and alternatives falling within the spirit and scope of the invention as defined by the appended claims.

DETAILED DESCRIPTION

Each of the example methods and arrangements described below are directed to detecting a latch-up condition in a semiconductor device. These methods and arrangements have been found to be highly advantageous in connection with detecting a latch-up condition in a CMOS-type semiconductor devices, such as flip chips and other IC packages (e.g., PGAs and DIPs) having exposable circuits from the backside that are highly-integrated and difficult to otherwise isolate and detect. Various benefits and aspects of the present invention can be appreciated using example embodiments in this context.

FIG. 1 shows an example representation of logic circuit a semiconductor device that is susceptible to latching-up. The logic circuit is a CMOS inverter having sufficiently close P-channel and N-channel transistors 110 and 112 proximity of the circuitry fosters the creation of a parasitic pnpn transistor circuits 114 and 116 within the device. These parasitic transistors may, in the presence of certain stimuli, become forward-biased. If power is supplied to the device, current may flow through the forward-biased transistors as indicated by the arrows, and the device may latch-up thereby pulling current from the positive supply source (Vdd) to a lower voltage level terminal (Vss) and thereby effecting an "ON" state of the pnpn-arranged circuitry.

In connection with the present invention, it has been discovered that a latch-up condition can be induced for a targeted circuit area in an IC by injecting electron-hole pairs into the EPI layer of the IC substrate. These electron-hole pairs are capable of causing parasitic transistors within the device to become forward biased, creating a condition in which latch-up could occur. As the intensity or the scan rate of the laser beam is increased, latch-up is more likely to occur because the scan rate effects the transient response.

According to one example embodiment consistent with the present invention, a testing arrangement includes a CMOS-type device with a logic circuit having parasitic bipolar transistors that can be induced into a latch-up mode in which high-levels of current are passed from a first node to a second node. The latch-up mode is induced by scanning through the backside of the semiconductor device with a laser beam having an adequately-strong intensity level to satisfy the criteria necessary for this adverse condition to arise. Any latched-up circuits can then be readily viewed using conventional testing techniques. For example, using conventional microscopy equipment to provide images of the circuit under test, a latched-up circuit can then be readily viewed as a "spot" on a monitor. Such spots are often exhibited as a color-intensity change, such as an increased intensity of color for a circuit region passing high levels of current due to the latch-up condition.

In another example embodiment of the present invention, latch-up is induced and detected by injecting electron-hole pairs through the backside of a semiconductor device using a laser-beam scan procedure to establish a first upper threshold at or under which latch-up conditions should not occur. For a flip-chip type device, the backside (opposite the circuit side) is first globally thinned, for example, using CMP or FIB techniques to about a 100 micron thickness, and, if desired, further thinned using a laser etching process over a particular target circuit. The first upper threshold can be viewed as a tolerance threshold in that injecting electron-hole pairs at a laser-beam intensity level higher than this first upper threshold may cause latch-up conditions for certain circuits, but only due to the unusually high increase in intensity. This first upper threshold may be established, for example, according to a latch-up standard, according to an IC latch-up specification, or by testing for a particular type of IC. With this first upper threshold being established, the intensity of the beam is set just below (or at) this threshold and the IC surface is scanned to induce latch-up for any circuits in the IC that are more unacceptably susceptible to latch-up. The device is then tested, for example as described above using conventional microscopy equipment, to detect the location of the latched-up circuitry.

Figure 2:
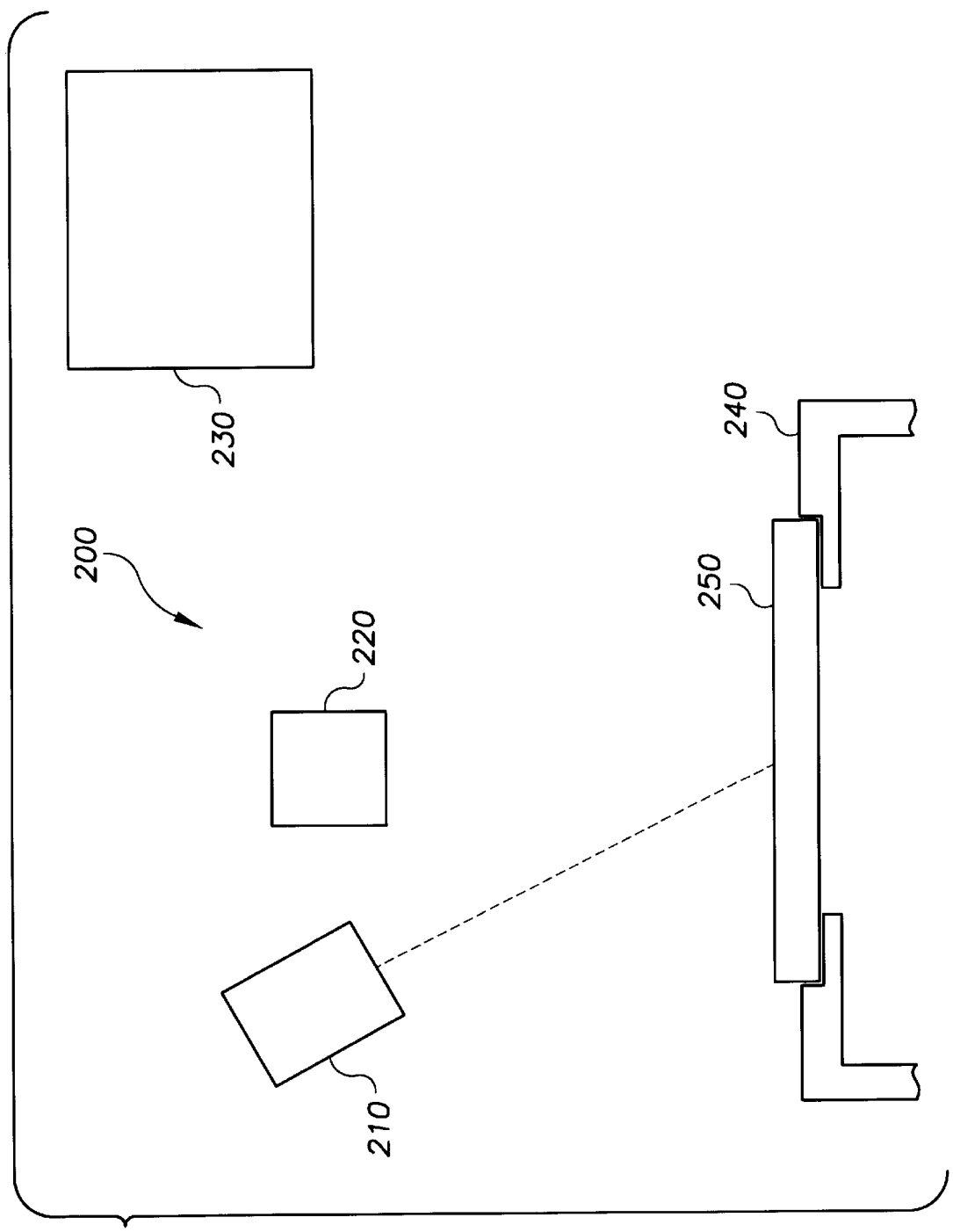
FIG. 2 is a diagram of an example system for detecting a latch-up condition, according to the present invention.

FIG. 2 illustrates another example embodiment in which a system 200 is used to induce and detect latch-up. A semiconductor device 250 is held by a fixture 240. A case beam 210 is directed through the backside of silicon at the semiconductor device 250. The beam 210 may include, for example, a laser beam. A microscope 220 is used to detect a response from the device. A monitor 230 is adapted to monitor information from the device related to latch-up.

Figure 3:
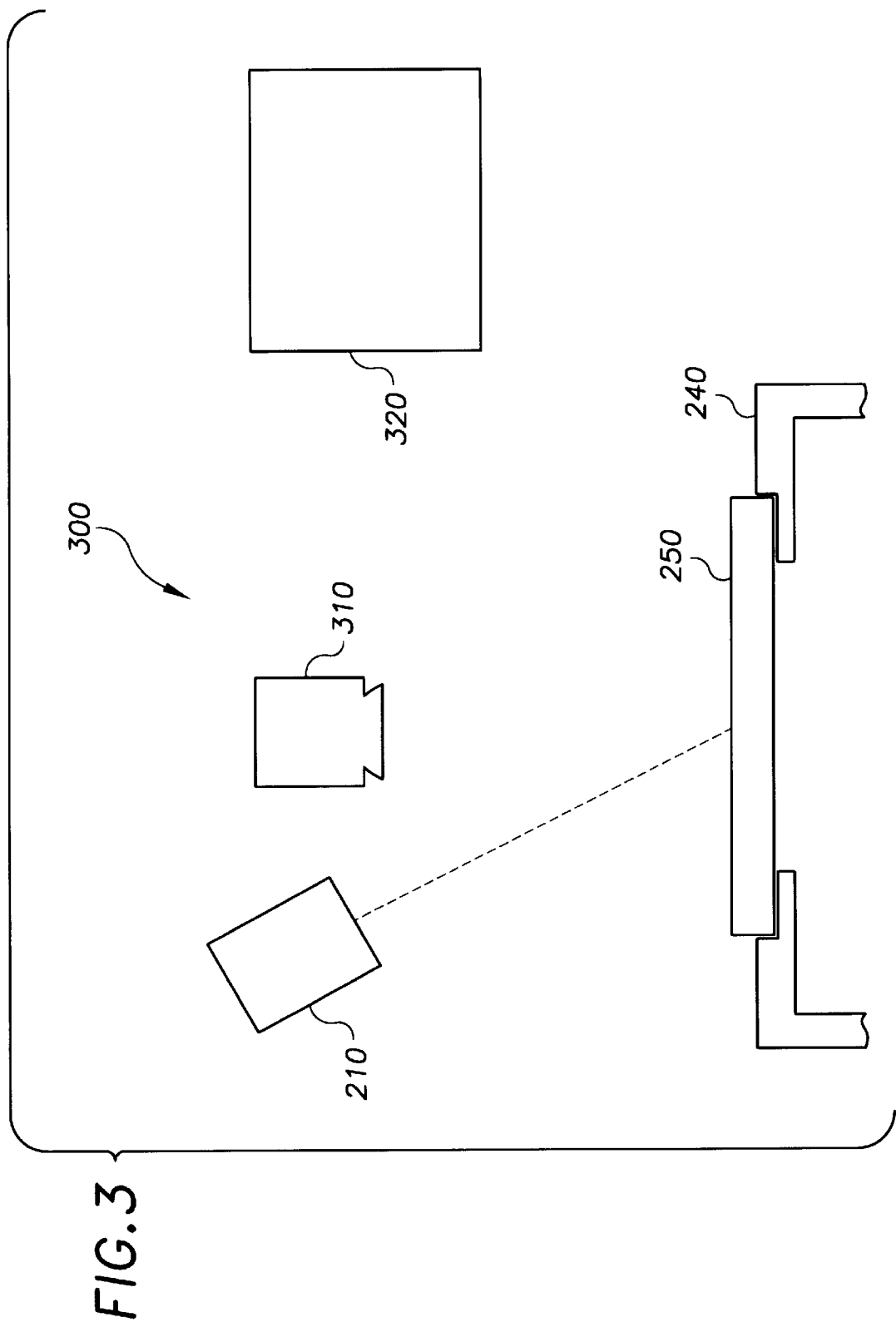
FIG. 3 is a diagram of another example system for detecting a latch-up condition, according to the present invention, wherein a video camera and a computer arrangement are used to detect a latch-up response.

Referring to the example system of FIG. 3, a laser device 210 is used to direct a laser beam at a semiconductor device 250 that is secured in a fixture 240. A video camera 310 is arranged to record an image of the semiconductor device. The video camera 310 is firther coupled to a computer device 320. The computer device 320 includes a light-and/or color-processing program used to differentiate "spots" that indicate a latch-up condition. Such spots typically appear both brighter and show increased degrees of redness.

Figure 4:
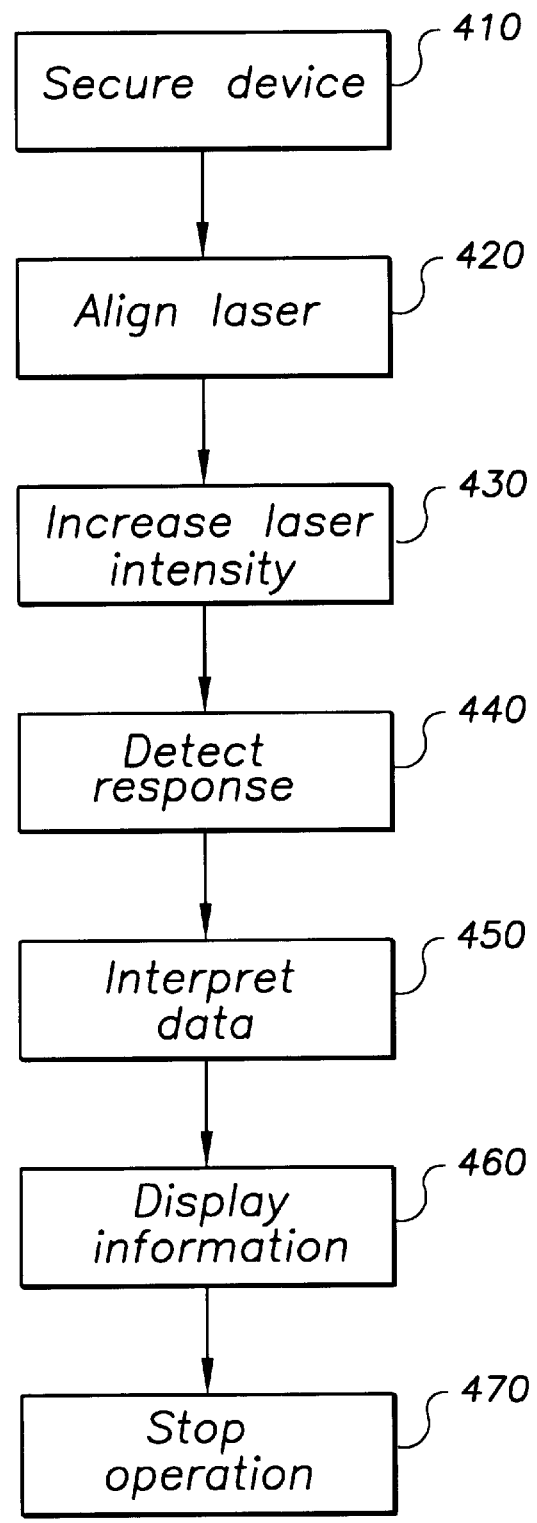
FIG. 4 is an example flow chart depicting one operation of an example system for automatically indicating a latch-up condition.

FIG. 4 shows an example flow chart depicting the operation of a system for detecting latch-up. At block 410 a semiconductor device is secured in a fixture. At block 420, a laser aligned with a region in the semiconductor device is used to direct an energy field at the region in the device. The intensity of the energy field is increased at block 430. At block 440, a camera or microscope is used to detect a response of the device to increased intensity. Optionally, the camera or microscope is coupled to a computer system configured and arranged to indicate whether a latch-up condition is present, and, at block 450, the computer is used to interpret the data from the camera and determine automatically if a latch-up condition is present. The computer displays information at block 460. The information displayed may, for example, include a location of the circuit latching-up (relative to an alignment grid), an indication of changes in current draw by circuits in the semiconductor device, or an indication of heat build-up in the device. Alternatively, the location of the circuit latching-up may be ascertained using manual mappings to circuit overlays and schematics. Once located, the surface immediately over the subject circuit can be laser-zapped or otherwise marked to readily identify the location. After a latch-up condition, or lack thereof, has been detected, the laser beam is turned off at block 470.

In one particular example embodiment, using a laser set to deliver 0.5 Watts, an ARC, such as $PbF_2$, is advantageous in that "fizeau rings" at lower magnitudes are minimized and the laser intensity at the silicon is maximized.

The various embodiments described above are provided by way of illustration only and are not intended to limit the invention. Those skilled in the art will readily recognize various modifications and changes that may be made to the present invention, without strictly following the example embodiments and applications illustrated and described herein. Thus, the present invention is not limited by the example embodiments; rather, the scope of the present invention is set forth in the following claims.

What is claimed is:

1. A method for detecting a latch-up condition in a semiconductor device having a circuit exposable via a backside of the device, comprising:
    scanning through the backside of the semiconductor device with a laser beam having an initial intensity and scan rate; and
    detecting whether a latch-up condition is present in response to the beam.

2. A method for detecting a latch-up condition in a semiconductor device, according to claim 1, wherein scanning through the backside of the semiconductor device with a beam includes scanning at a first intensity and scan rate, and further including changing the intensity of the beam or scan rate, applying the beam with the increased intensity or scan rate to the semiconductor device and, therefrom, differentiating between regions of the device that are more and less susceptible to latch-up.

3. A method for detecting a latch-up condition in a semiconductor device, according to claim 2, wherein changing the intensity includes decreasing the intensity.

4. A method for detecting a latch-up condition in a semiconductor device, according to claim 1, wherein changing the intensity includes increasing the intensity.

5. A method for detecting a latch-up condition in a semiconductor device, according to claim 1, wherein changing the scan rate includes increasing the scan rate.

6. A method for detecting a latch-up condition in a semiconductor device, according to claim 1, wherein changing the scan rate includes decreasing the scan rate.

7. A method for detecting a latch-up condition in a semiconductor device, according to claim 1, wherein detecting includes detecting that a power node is supplying an increased amount of current.

8. A method for detecting a latch-up condition in a semiconductor device, according to claim 1, further including determining that the latch-up condition is present in the semiconductor device in a designated region.

9. A method for detecting a latch-up condition in a semiconductor device, according to claim 1, further including marking the semiconductor device to indicate the location of a latch-up circuit.

10. A method for detecting a latch-up condition in a semiconductor device, according to claim 1, further including determining a location in the device where latch-up is more susceptible than another location.

11. A method for detecting a latch-up condition in a semiconductor device, according to claim 1, further including applying at least one marking on the semiconductor device to indicate a location where at least one latch-up condition is susceptible.

12. A method for detecting a latch-up condition in a semiconductor device, according to claim 1, wherein detecting whether a latch-up condition is present includes using a laser scanning microscope.

13. A method for detecting a latch-up condition in a semiconductor device, according to claim 12, wherein detecting whether a latch-up condition is present includes visually indicating a spot with an increase in current draw through a circuit within the device.

14. A system to detect a latch-up condition in a semiconductor device having a circuit exposable via a backside of the device, comprising:
    means for applying a beam;
    means for securing the semiconductor device so that the laser beam can scan through the backside of the semiconductor device at a first intensity and scan rate; and
    means for indicating if a latch-up condition is present in response to an increased intensity or scan rate of the laser beam over a designated region of the semiconductor device.

15. A system to detect a latch-up condition in a semiconductor device, according to claim 14, further including visual means for indicating increases in current drain by circuits in the semiconductor device.

16. A method for detecting a latch-up condition in a semiconductor device having a circuit exposable via a backside of the device, comprising:
    scanning a surface of the semiconductor device with a beam having a predetermined intensity; and
    detecting whether at least one latch-up condition is present in response to the beam.

17. A method for detecting a latch-up condition in a semiconductor device, according to claim 16, further including using microscopy to determine the location of a region where said at least one latch-up condition is present.

* * * * *